(12) United States Patent
Ono (10) Patent No.: US 8,907,836 B2
(45) Date of Patent: Dec. 9, 2014

(54) SWITCHED-CAPACITOR INPUT CIRCUIT AND ANALOG-TO-DIGITAL CONVERTER INCLUDING THE SAME

(75) Inventor: Toshiaki Ono, Ebina (JP)

(73) Assignee: Canon Kabushiki Kaisha, Tokyo (JP)

(*) Notice: Subject to any disclaimer, the term of this patent is extended or adjusted under 35 U.S.C. 154(b) by 327 days.

(21) Appl. No.: 13/526,405

(22) Filed: Jun. 18, 2012

(65) Prior Publication Data

US 2012/0249352 A1   Oct. 4, 2012

Related U.S. Application Data

(63) Continuation of application No. 12/943,772, filed on Nov. 10, 2010, now Pat. No. 8,223,059.

(30) Foreign Application Priority Data

Dec. 9, 2009 (JP) ................. 2009-279813

(51) Int. Cl.
*H03M 1/12* (2006.01)
*H03M 1/06* (2006.01)

(52) U.S. Cl.
CPC ............ *H03M 1/0607* (2013.01); *H03M 1/12* (2013.01)
USPC ............................. 341/172; 341/122; 341/155

(58) Field of Classification Search
CPC ........................................................ H03M 1/12
USPC .................. 341/172, 155, 122; 327/94; 330/9
See application file for complete search history.

(56) References Cited

U.S. PATENT DOCUMENTS

| | | | |
|---|---|---|---|
| 6,097,326 A * | 8/2000 | Opris et al. | 341/161 |
| 6,169,427 B1 | 1/2001 | Brandt | |
| 6,433,712 B1 | 8/2002 | Ohnhaeuser et al. | |
| 6,445,331 B1 * | 9/2002 | Stegers | 341/172 |
| 6,642,751 B1 | 11/2003 | Quinn | |
| 7,102,558 B2 * | 9/2006 | Deval | 341/150 |
| 7,733,168 B2 * | 6/2010 | Higuchi | 330/9 |
| 7,812,753 B1 * | 10/2010 | Myles et al. | 341/144 |
| 8,026,760 B1 | 9/2011 | Prasad | |
| 2011/0133966 A1 | 6/2011 | Ono | |

FOREIGN PATENT DOCUMENTS

JP     2003060505 A     2/2003

* cited by examiner

*Primary Examiner* — Peguy Jean Pierre
(74) *Attorney, Agent, or Firm* — Fitzpatrick, Cella, Harper & Scinto (57) ABSTRACT

A switched-capacitor input circuit which receives an analog input signal, and samples and holds the analog input signal, comprising a differential amplifier, a first capacitor, one terminal of the first capacitor being connected to a non-inverting input terminal of the differential amplifier, a second capacitor, one terminal of the second capacitor being connected to an inverting input terminal of the differential amplifier, a first switch configured to connect the other terminal of the first capacitor to one of a first reference voltage and a second reference voltage, a second switch configured to connect the other terminal of the second capacitor to one of the first reference voltage and the second reference voltage, and a third switch configured to connect the other terminal of the first capacitor to the other terminal of the second capacitor.

7 Claims, 7 Drawing Sheets

| OFFSET CORRECTION | SW6 | SW7 | SW8 | SW$_{C1}$ | SW$_{C2}$ | SW$_{C3}$ | SW$_{C4}$ | SW$_{C5}$ | SW$_{C6}$ |
|---|---|---|---|---|---|---|---|---|---|
| 000 | OFF | OFF | OFF | VrefH | VrefH | VrefH | VrefL | VrefL | VrefL |
| 001 | ON | OFF | OFF | OFF | VrefH | VrefH | OFF | VrefL | VrefL |
| 002 | OFF | OFF | OFF | VrefL | VrefH | VrefH | VrefH | VrefL | VrefL |
| 010 | OFF | ON | OFF | VrefH | OFF | VrefH | VrefL | OFF | VrefL |
| ⋮ | ⋮ | ⋮ | ⋮ | ⋮ | ⋮ | ⋮ | ⋮ | ⋮ | ⋮ |
| 020 | OFF | OFF | OFF | VrefH | VrefL | VrefH | VrefL | VrefH | VrefL |
| ⋮ | ⋮ | ⋮ | ⋮ | ⋮ | ⋮ | ⋮ | ⋮ | ⋮ | ⋮ |
| 100 | OFF | OFF | ON | VrefH | VrefH | OFF | VrefL | VrefL | OFF |
| ⋮ | ⋮ | ⋮ | ⋮ | ⋮ | ⋮ | ⋮ | ⋮ | ⋮ | ⋮ |
| 222 | OFF | OFF | OFF | VrefL | VrefL | VrefL | VrefH | VrefH | VrefH |

SWITCHED-CAPACITOR INPUT CIRCUIT AND ANALOG-TO-DIGITAL CONVERTER INCLUDING THE SAME

This application is a continuation of U.S. patent application Ser. No. 12/943,772, filed Nov. 10, 2010, the contents of which are incorporated by reference herein.

BACKGROUND OF THE INVENTION

1. Field of the Invention

The present invention relates to a switched-capacitor input circuit and an analog-to-digital converter (ADC) including the same and, for example, a method and circuit for correcting an offset component of an input signal of an ADC and, more particularly, to offset correction of an input signal of a switched-capacitor ADC.

2. Description of the Related Art

As a circuit for removing an offset component of an input signal and extracting significant signal information in an ADC, a circuit having a capacitor for offset correction using a switched-capacitor circuit is known (Japanese Patent Laid-Open No. 2003-060505). This circuit performs offset correction at a desired accuracy using a necessary number of binary weighted capacitors.

However, to increase the offset correction accuracy using the technique described in Japanese Patent Laid-Open No. 2003-060505, capacitors having smaller capacitance values need to be added. To double the accuracy, a capacitor having a capacitance value ½ needs to be added. To quadruple the accuracy, a capacitor having a capacitance value ½ and a capacitor having a capacitance value ¼ need to be added. When the capacitance value is decreased to obtain a higher accuracy, the parasitic capacitances of connected wiring lines, switches, and the like become nonnegligible, leading to difficulty in accurately binary weighting the capacitance ratio. This makes it harder to maintain the offset correction accuracy. Hence, there is actually a limit to adding capacitors with smaller capacitance values.

SUMMARY OF THE INVENTION

The present invention provides an input circuit capable of advantageously controlling a potential change smaller than before without using any capacitor with a small capacitance value and an analog-to-digital converter including the same.

The first aspect of the present invention provides a switched-capacitor input circuit which receives an analog input signal, and samples and holds the analog input signal, comprising a differential amplifier, a first capacitor, one terminal of the first capacitor being connected to a non-inverting input terminal of the differential amplifier, a second capacitor, one terminal of the second capacitor being connected to an inverting input terminal of the differential amplifier, a first switch configured to connect the other terminal of the first capacitor to one of a first reference voltage and a second reference voltage, a second switch configured to connect the other terminal of the second capacitor to one of the first reference voltage and the second reference voltage, and a third switch configured to connect the other terminal of the first capacitor to the other terminal of the second capacitor, wherein upon sampling, the first switch connects the other terminal of the first capacitor to the first reference voltage, and the second switch connects the other terminal of the second capacitor to the second reference voltage, and upon holding, the third switch connects the other terminal of the first capacitor to the other terminal of the second capacitor.

The second aspect of the present invention provides a switched-capacitor input circuit which receives an analog input signal, and samples and holds the analog input signal, comprising a differential amplifier, a first capacitor, one terminal of the first capacitor being connected to a non-inverting input terminal of the differential amplifier, a second capacitor, one terminal of the second capacitor being connected to an inverting input terminal of the differential amplifier, a first switch configured to connect the other terminal of the first capacitor to one of a first reference voltage and a second reference voltage, a second switch configured to connect the other terminal of the second capacitor to one of the first reference voltage and the second reference voltage, and a third switch configured to connect the other terminal of the first capacitor to the other terminal of the second capacitor, wherein upon sampling, the third switch connects the other terminal of the first capacitor to the other terminal of the second capacitor, and upon holding, the first switch connects the other terminal of the first capacitor to the first reference voltage, and the second switch connects the other terminal of the second capacitor to the second reference voltage.

The third aspect of the present invention provides an analog-to-digital converter comprising the input circuit as defined above, and an analog-to-digital conversion circuit configured to perform analog-to-digital conversion of an output signal from the input circuit.

According to one aspect of the present invention, the input terminals of first and second offset correction capacitors are short-circuited so as to obtain a function of causing charge movement between the two capacitors and thus decreasing the potential change on the output terminal side of a differential amplifier. This allows control of a potential change smaller than before without using any capacitor with a small capacitance value. It is therefore possible to implement a more accurate, binary weighted offset correction amount and accurately perform offset correction in an analog-to-digital converter.

Further features of the present invention will become apparent from the following description of exemplary embodiments with reference to the attached drawings.

DESCRIPTION OF THE EMBODIMENTS

First Embodiment

An arrangement and operation according to the first embodiment of the present invention will be described with reference to FIGS. 1A to 4.

<Example of Arrangement of Analog-to-Digital Converter (ADC) of First Embodiment>

Figure 1A:
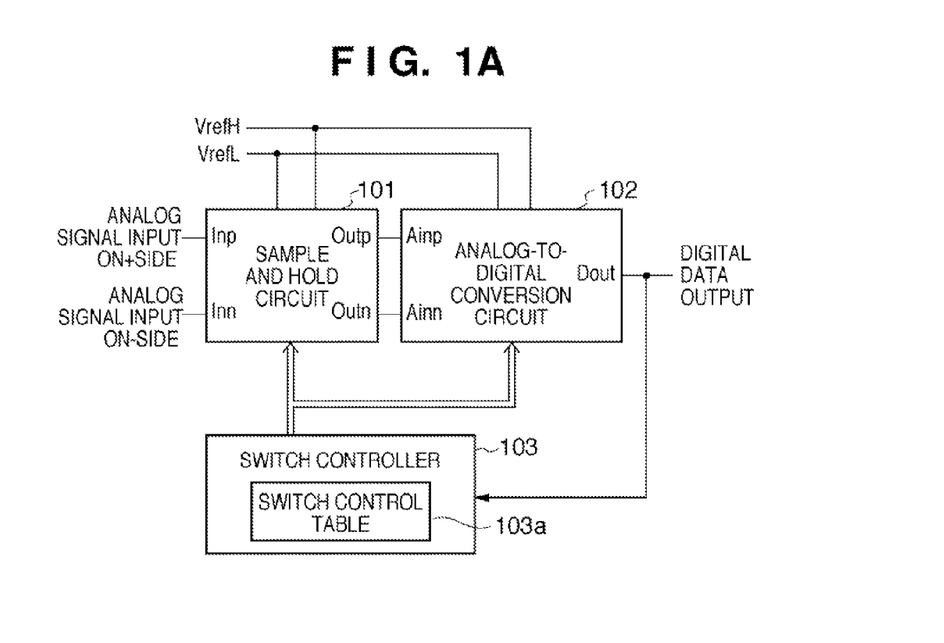
FIG. 1A is a block diagram showing an example of the arrangement of an analog-to-digital converter according to the first embodiment.

In a differential ADC shown in FIG. 1A, a sample and hold circuit 101 serving as an input circuit receives differential analog input signals input to input terminals Inp and Inn, samples and holds the signals, and outputs them to output terminals Outp and Outn. An analog-to-digital conversion circuit 102 receives the output signals, converts them into digital data, and outputs it to an output terminal Dout. VrefL and VrefH are lower and higher reference voltages, respectively. The analog-to-digital conversion circuit 102 compares the two reference voltages with the voltages of the analog input signals, and converts the analog input signals into digital data. In the first embodiment, the two reference voltages are supplied to the sample and hold circuit 101 as well and used for input offset correction. A switch controller 103 outputs control signals to control switching in the sample and hold circuit 101 and the analog-to-digital conversion circuit 102. The switch controller 103 has a switch control table 103a that stores combinations of control signals to switches corresponding to the statuses of each circuit and offset correction values.

(Example of Arrangement of Switch Control Table 103a)

Figure 1B:
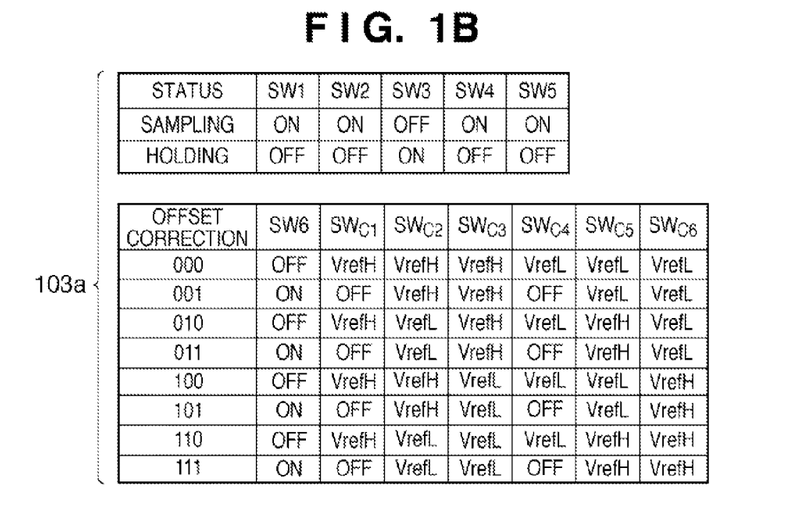
FIG. 1B is a view showing an example of a switch control table according to the first embodiment.

The switch control table 103a in FIG. 1B stores control signals to control the switches in correspondence with the statuses of the sample and hold circuit 101 and offset correction values. In this example, the control signals in detailed examples of the sample and hold circuit 101 shown in FIGS. 2A, 2B, 3A, and 3B are represented by the states of switches. The offset correction in FIG. 1B is done by binary weighting of three bits, that is, lower, intermediate, and higher bits.

<Examples of Circuit and Operation of Sample and Hold Circuit 101>

(Example of Sampling)

Figure 2A:
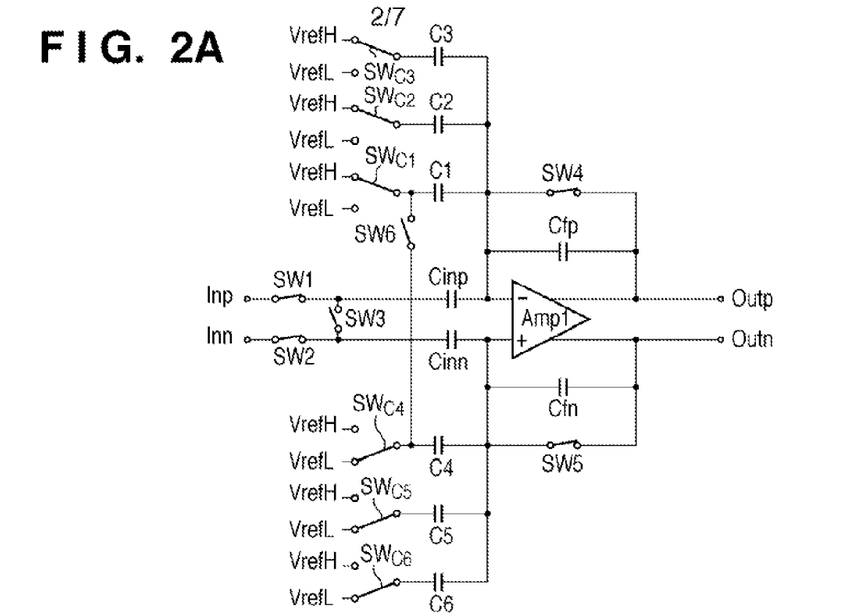
FIG. 2A is a connection diagram showing the state of a sample and hold circuit according to the first embodiment upon sampling.

FIG. 2A is a circuit diagram of the switched-capacitor sample and hold circuit 101 in FIG. 1A, which illustrates the connection state upon sampling. Amp1 is a differential amplifier having a non-inverting input terminal and an inverting input terminal, Cinp and Cinn are input capacitors, and Cfp and Cfn are feedback capacitors. C1 to C3 are first capacitors for offset correction, and C4 to C6 are second capacitors for offset correction. One terminal of each of the capacitors C1 to C6 is connected to the differential amplifier, and the other terminal is connected to the first or second reference voltage via a corresponding one of first switches $SW_{C1}$ to $SW_{C3}$ and second switches $SW_{C4}$ to $SW_{C6}$. The capacitors C1 to C3 serve as a plurality of first capacitive elements of a first capacitor for offset correction, and the capacitors C4 to C6 serve as a plurality of second capacitive elements of a second capacitor for offset correction. The capacitance ratio of the capacitors is Cinp:Cinn:Cfp:Cfn:C1:C2:C3:C4:C5:C6=10:10:5:5:1:1:2:1:1:2. The capacitors C1, C2, C4, and C5 have the same capacitance value that is not binary weighted. However, since the connection destinations are different, binary weighting is implemented by an offset correction value that appears as an output voltage. Referring to FIG. 1B, upon sampling, the terminals of the capacitors Cfp and Cfn are short-circuited by switches SW4 and SW5 so as to reset the outputs Outp and Outn. The capacitors Cinp and Cinn are connected to the inputs Inp and Inn via switches SW1 and SW2 so as to store the input signals in the capacitors Cinp and Cinn. The capacitors C1 to C3 are connected to the reference voltage VrefH, and the capacitors C4 to C6 are connected to the reference voltage VrefL to accumulate charges.

(Example of Holding without Offset Correction)

Figure 2B:
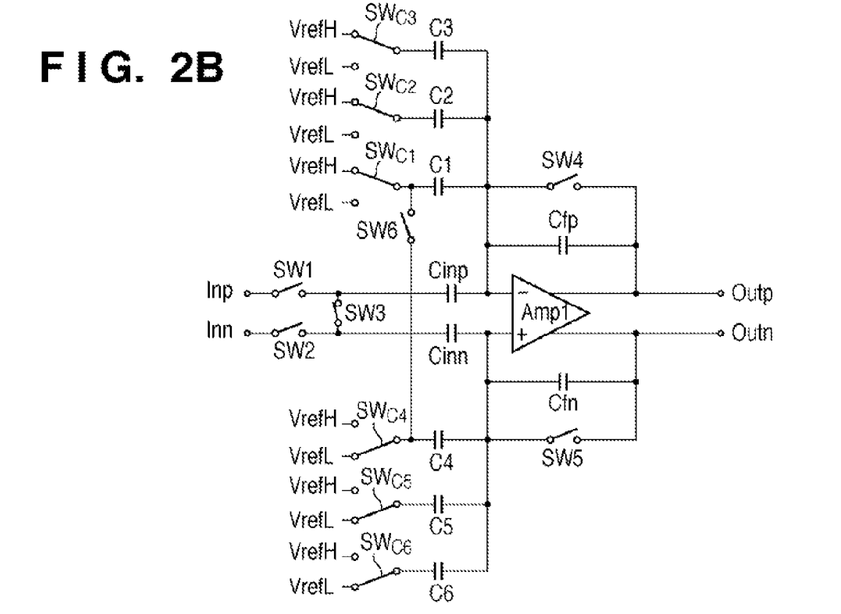
FIG. 2B is a connection diagram showing the state of the sample and hold circuit according to the first embodiment upon holding without offset correction.

FIG. 2B is a circuit diagram showing the connection state of the sample and hold circuit 101 upon holding without offset component correction. This indicates the state upon holding with offset correction (000) in FIG. 1B. A switch SW3 short-circuits the capacitors Cinp and Cinn to set them at an equipotential. Charges accumulated in the capacitors Cinp and Cinn then move to the capacitors Cfp and Cfn, and appear as an output voltage. Since Cinp:Cfp=Cinn:Cfn=10:5=2:1, (Outp−Outn)=2×(Inp−Inn) based on charge conservation and the relation Q=CV. Since the connection states of the capacitors C1 to C6 are the same as in sampling, no charge movement occurs, and the output voltage is not affected.

(Example of Holding with Correction of First Offset Amount)

Figure 3A:
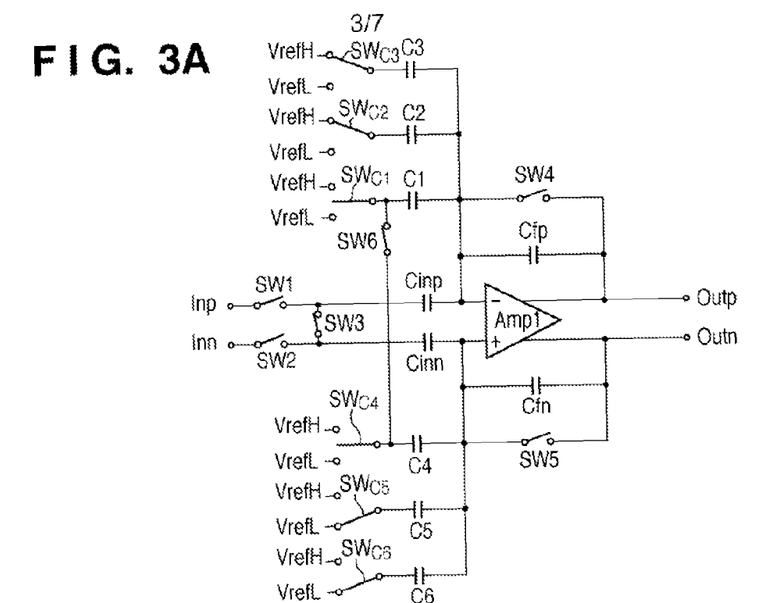
FIGS. 3A and 3B are connection diagrams showing the states of the sample and hold circuit according to the first embodiment upon holding with offset correction.

FIG. 3A is a circuit diagram showing the connection state of the sample and hold circuit 101 upon holding with correction of a first offset amount. Even in this case, the sampling state is the same as in FIG. 2A. The connection states of the capacitors C1 and C4 are different from those in the holding state without offset correction shown in FIG. 2B. Upon sampling, the capacitor C1 is connected to the reference voltage VrefH, and the capacitor C4 is connected to the reference voltage VrefL. Upon holding, a third switch SW6 short-circuits the capacitors C1 and C4 to set them at an equipotential. Charges accumulated in the capacitors C1 and C4 then move to the capacitors Cfp and Cfn, and affect the output voltage. Since C1:Cfp=C4:Cfn=1:5, the amount is given by 0.2×(VrefH−VrefL). This is the offset correction amount. As a result, considering charge movement from the capacitors Cinp and Cinn to the capacitors Cfp and Cfn, the output voltage is given by (Outp−Outn)=2×(Inp−Inn)+0.2×(VrefH−VrefL).

(Example of Holding with Correction of Second Offset Amount)

Figure 3B:
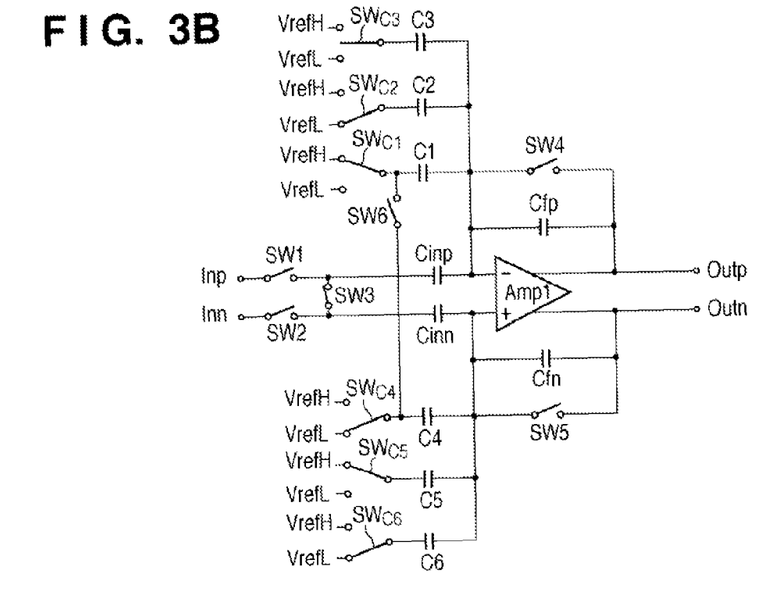

FIG. 3B is a circuit diagram showing the connection state of the sample and hold circuit 101 upon holding with correction of a second offset amount. Even in this case, the sampling state is the same as in FIG. 2A. The connection states of the capacitors C2 and C5 are different from those in the holding state without offset correction shown in FIG. 2B. Upon sampling, the capacitor C2 is connected to the reference voltage VrefH, and the capacitor C5 is connected to the reference voltage VrefL. Upon holding, the capacitor C2 is connected to the reference voltage VrefL, and the capacitor C5 is connected to the reference voltage VrefH. In this case, the charges accumulated in the capacitors C2 and C5 move to the capacitors Cfp and Cfn, and the reference voltages VrefH and VrefL are switched so as to affect the output voltage. Since C2:Cfp=C5:Cfn=1:5, the amount is given by 0.4×(VrefH−VrefL). This is the offset correction amount. As a result, considering charge movement from the capacitors Cinp and Cinn to the capacitors Cfp and Cfn, the output voltage is given by (Outp−Outn)=2×(Inp−Inn)+0.4×(VrefH−VrefL). That is, offset correction in an amount twice that in the holding state in FIG. 3A is possible. Conversely, the state in FIG. 3A enables offset correction in an amount ½ that in FIG. 3B.

<Example of Control Procedure of Switch Controller 103 of Embodiment>

Figure 4:
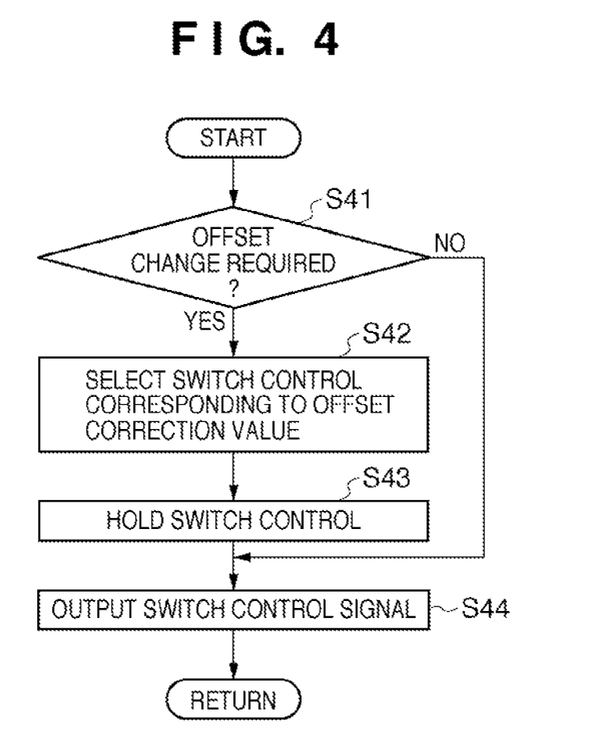
FIG. 4 is a flowchart illustrating an example of the processing procedure of a switch controller according to the embodiment.

According to the example of the control procedure of the switch controller 103 shown in FIG. 4, the switch controller 103 determines in step S41 based on digital data output from the analog-to-digital conversion circuit 102 whether offset change is necessary. If necessary, in step S42, the switch controller 103 selects a combination of switch settings corresponding to the offset correction value from the table shown in FIG. 1B. In step S43, the switch controller 103 holds the selected switch setting combination for offset correction from then on. In step S44, the switch controller 103 outputs, to the sample and hold circuit 101, switch control signals based on the new switch setting combination set in step S43 or a previous switch setting combination (if NO in step S41). This control procedure may be either executed as software under the CPU of the switch controller 103 or incorporated in the switch controller 103 as hardware.

Advantage of First Embodiment

As described above, the capacitors C1, C2, C4, and C5 have the same capacitance value. However, when the switch connection states are switched to halve the potential change amount between sampling and holding, the offset correction amount can be ½. Generally, the analog-to-digital conversion circuit 102 requires two kinds of reference voltages, that is, lower and higher reference voltages. However, sharing VrefL and VrefH as these reference voltages obviates the necessity of preparing a new reference voltage. In addition, to halve the potential change amount between sampling and holding, the differential positive- and negative-side offset correction capacitors are short-circuited. Using this method allows to change the potential change amount without newly preparing a third reference voltage. As described above, the method of the present invention makes it possible to perform offset correction in a small amount without providing any capacitive element having a small capacitance value. In this embodiment, although C1:C2:C3=C4:C5:C6=1:1:2, an offset correction amount binary weighted at 1:2:4 can be obtained. It is therefore possible to implement a 3-bit accuracy, that is, an offset correction accuracy in eight steps without making the minimum capacitance value (corresponding to the capacitors C1 and C4 in this circuit) smaller.

Note that in this embodiment, the capacitor C1 is connected to the reference voltage VrefH while the capacitor C4 is connected to the reference voltage VrefL upon sampling, and the capacitors C1 and C4 are short-circuited upon holding, thereby implementing offset correction of 0.2×(VrefH−VrefL). However, another connection method can also implement offset correction in the same amount. For example, even when the circuit operates so as to short-circuit the capacitors C1 and C4 upon sampling, and connect the capacitor C1 to the reference voltage VrefL and the capacitor C4 to the reference voltage VrefH upon holding, offset correction of 0.2×(VrefH−VrefL) can be implemented.

Second Embodiment

An arrangement and operation according to the second embodiment of the present invention will be described with reference to FIGS. 5A to 7C.

<Example of Arrangement of Analog-to-Digital Converter (ADC) of Second Embodiment>

Figure 5A:
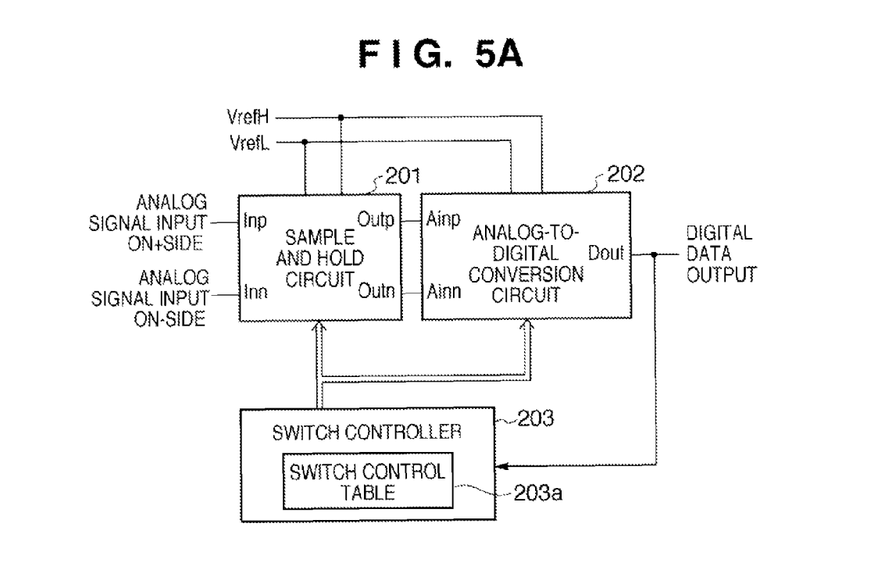
FIG. 5A is a block diagram showing an example of the arrangement of an analog-to-digital converter according to the second embodiment.

In an ADC according to the second embodiment shown in FIG. 5A, a differential sample and hold circuit 201 samples differential analog signals input to input terminals Inp and Inn. The sample and hold circuit 201 holds the signals, and outputs them to output terminals Outp and Outn. A differential analog-to-digital conversion circuit 202 receives the output signals, converts them into digital data, and outputs it to an output terminal Dout. VrefL and VrefH are lower and higher reference voltages, respectively. The differential analog-to-digital conversion circuit 202 compares the two reference voltages with the voltages of the input analog signals, and converts the signals into digital data. In this embodiment, the two potentials are supplied to the differential sample and hold circuit 201 as well and used for input offset correction. A switch controller 203 outputs control signals to control switching in the sample and hold circuit 201 and the analog-to-digital conversion circuit 202. The switch controller 203 has a switch control table 203a that stores combinations of control signals to switches corresponding to the statuses of each circuit and offset correction values. Note that the outline of processing of the switch controller 203 is the same as in the flowchart of FIG. 4 according to the first embodiment.

(Example of Arrangement of Switch Control Table 203a)

Figure 5B:
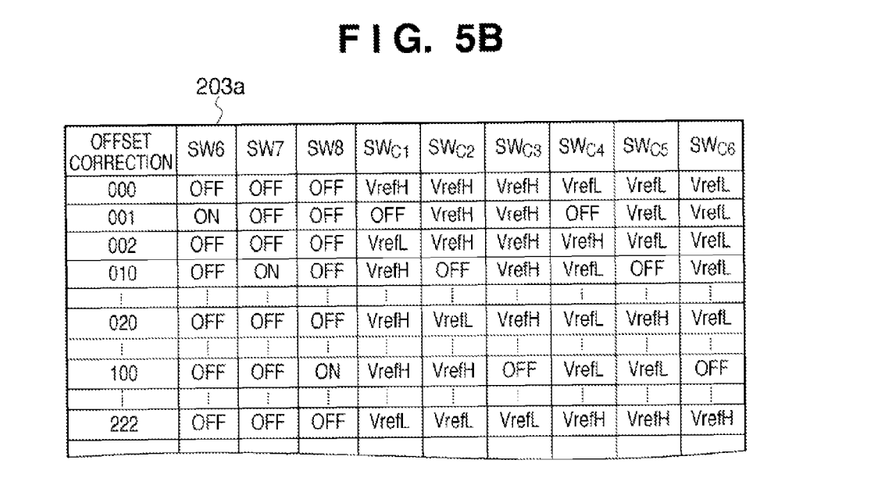
FIG. 5B is a view showing an example of a switch control table according to the second embodiment.

The switch control table 203a in FIG. 5B stores control signals to control the switches in correspondence with the offset correction values of the sample and hold circuit 201. In this example, the control signals in detailed examples of the sample and hold circuit 201 shown in FIGS. 6A, 6B, and 7A to 7C are represented by the states of switches. The offset correction in FIG. 5B is done by ternary weighting of three bits, that is, lower, intermediate, and higher bits. Note that the states of switches SW1 to SW5 corresponding to the statuses of the sample and hold circuit 201 are the same as in the first embodiment in FIG. 1B, and a description thereof will not be repeated.

<Examples of Circuit and Operation of Sample and Hold Circuit 201>

(Example of Sampling)

Figure 6A:
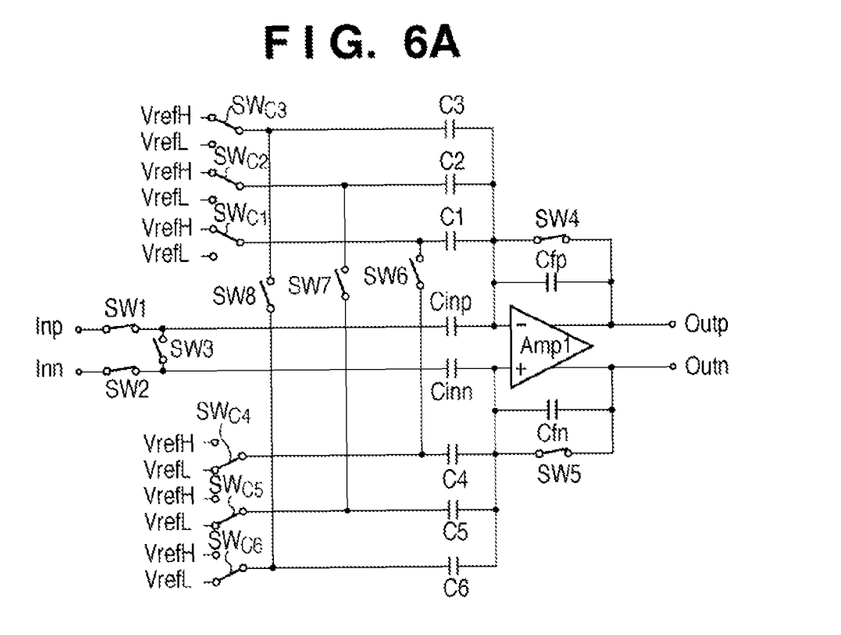
FIG. 6A is a connection diagram showing the state of a sample and hold circuit according to the second embodiment upon sampling.

FIG. 6A is a circuit diagram of the switched-capacitor sample and hold circuit 201 in FIG. 5A, which illustrates the connection state upon sampling. Amp1 is a differential amplifier, Cinp and Cinn are input capacitors, and Cfp and Cfn are feedback capacitors. C1 to C3 are first capacitors for offset correction, and C4 to C6 are second capacitors for offset correction. One terminal of each of the capacitors C1 to C6 is connected to the differential amplifier, and the other terminal is connected to the first or second reference voltage via a corresponding one of first switches $SW_{C1}$ to $SW_{C3}$ and second switches $SW_{C4}$ to $SW_{C6}$. The capacitors C1 to C3 serve as a plurality of first capacitive elements of a first capacitor for offset correction, and the capacitors C4 to C6 serve as a plurality of second capacitive elements of a second capacitor for offset correction. The capacitance ratio of the capacitors is Cinp:Cinn:Cfp:Cfn:C1:C2:C3:C4:C5:C6=100:100:50:50:1:3:9:1:3:9. Upon sampling, the terminals of the capacitors Cfp and Cfn are short-circuited by switches SW7 and SW8 so as to reset the outputs Outp and Outn. The capacitors Cinp and Cinn are connected to the inputs Inp and Inn via switches SW4 and SW5 so as to store the input signals in the capacitors Cinp and Cinn. The capacitors C1 to C3 are connected to the reference voltage VrefH, and the capacitors C4 to C6 are connected to the reference voltage VrefL to accumulate charges.

(Example of Holding without Offset Correction)

Figure 6B:
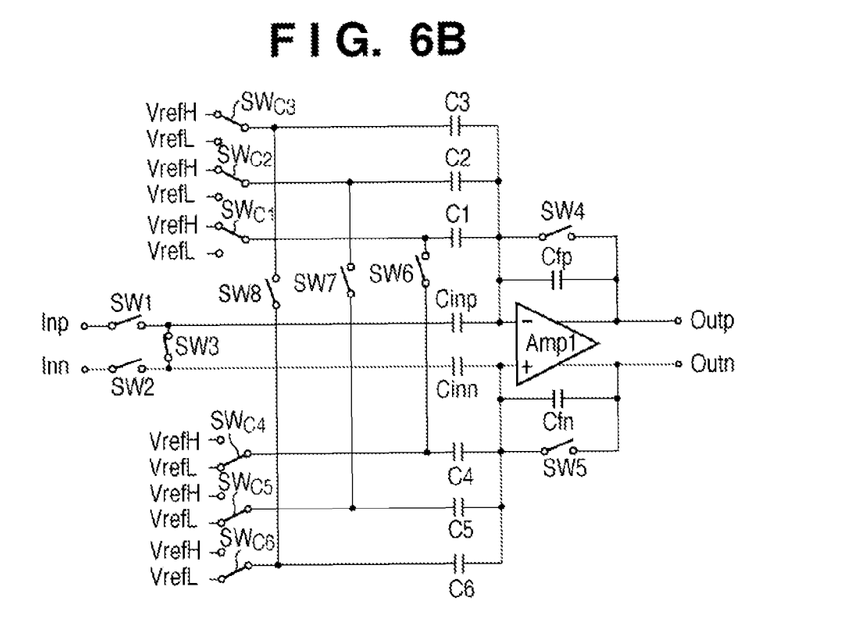
FIG. 6B is a connection diagram showing the state of the sample and hold circuit according to the second embodiment upon holding without offset correction.

FIG. 6B is a circuit diagram showing the connection state of the sample and hold circuit 201 upon holding without offset correction. First, the switches SW7 and SW8 open to cancel reset. After that, a switch SW6 short-circuits the capacitors Cinp and Cinn to set them at an equipotential. Charges accumulated in the capacitors Cinp and Cinn then move to the capacitors Cfp and Cfn, and appear as an output voltage. Since Cinp:Cfp=Cinn:Cfn=2:1, (Outp−Outn)=2×(Inp−Inn) based on charge conservation and the relation Q=CV. Since the connection states of the capacitors C1 to C6 are the same as in sampling, no charge movement occurs, and the output voltage is not affected.

(Example of Holding with Correction of First Offset Amount)

Figure 7A:
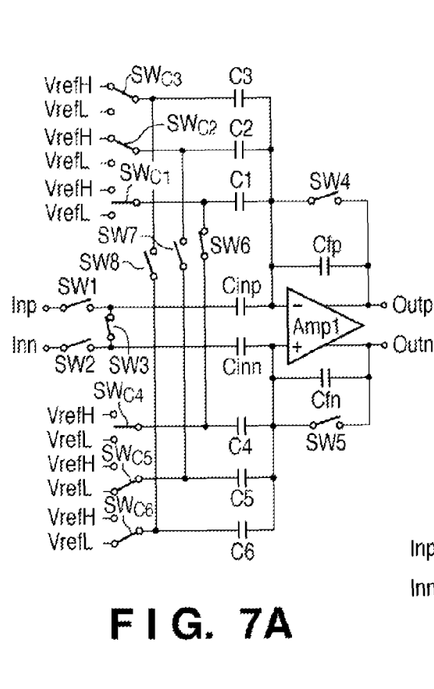
FIGS. 7A to 7C are connection diagrams showing the states of the sample and hold circuit according to the second embodiment upon holding with offset correction.

FIG. 7A is a circuit diagram showing the connection state of the sample and hold circuit 201 upon holding with correction of a first offset amount. Even in this case, the sampling state is the same as in FIG. 6A. The connection states of the capacitors C1 and C4 are different from those in the holding state without offset correction shown in FIG. 6B. Upon sampling, the capacitor C1 is connected to the reference voltage VrefH, and the capacitor C4 is connected to the reference voltage VrefL. Upon holding, a switch SW9 short-circuits the capacitors C1 and C4 to set them at an equipotential. Charges accumulated in the capacitors C1 and C4 then move to the capacitors Cfp and Cfn, and affect the output voltage. Since C1:Cfp=C4:Cfn=1:50, the amount is given by 0.02×(VrefH−VrefL). This is the offset correction amount. As a result, considering charge movement from the capacitors Cinp and Cinn to the capacitors Cfp and Cfn, the output voltage is given by (Outp−Outn)=2×(Inp−Inn)+0.02×(VrefH−VrefL).

(Example of Holding with Correction of Second Offset Amount)

Figures 7B, 7C:
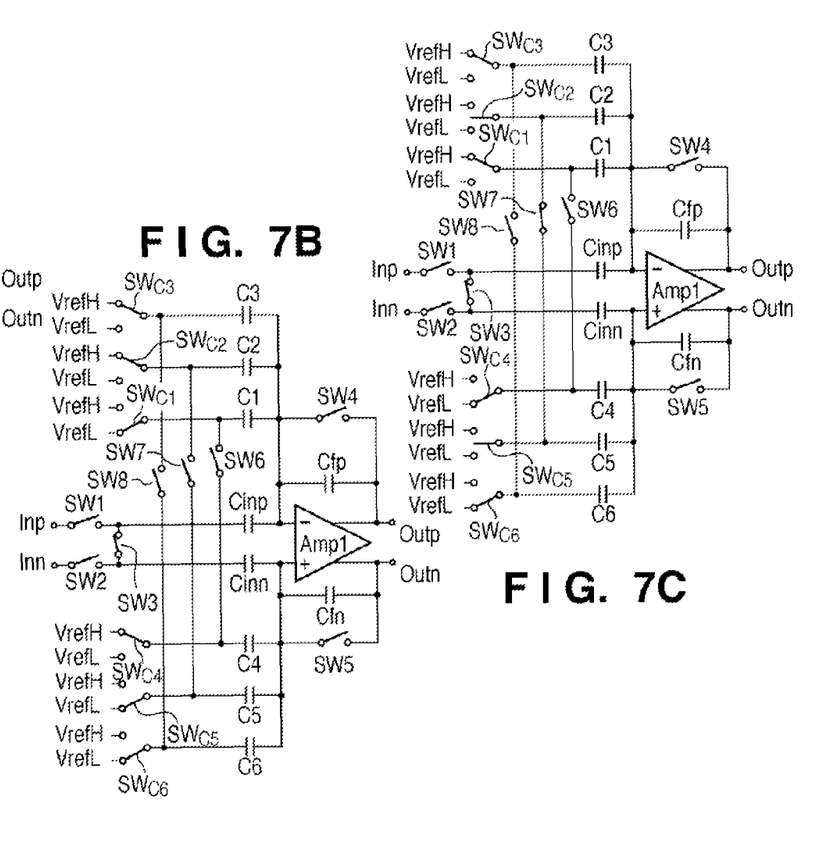

FIG. 7B is a circuit diagram showing the connection state of the sample and hold circuit 201 upon holding with correction of a second offset amount. Even in this case, the sampling state is the same as in FIG. 6A. The connection states of the capacitors C1 and C4 are different from those in the holding state without offset correction shown in FIG. 6B. Upon sampling, the capacitor C1 is connected to the reference voltage VrefH, and the capacitor C4 is connected to the reference voltage VrefL. Upon holding, the capacitor C1 is connected to the reference voltage VrefL, and the capacitor C4 is connected to the reference voltage VrefH. In this case, the charges accumulated in the capacitors C1 and C4 move to the capacitors Cfp and Cfn, and the reference voltages VrefH and VrefL are switched so as to affect the output voltage. Since C1:Cfp=C4:Cfn=1:50, the amount is given by 0.04×(VrefH−VrefL). This is the offset correction amount. As a result, considering charge movement from the capacitors Cinp and Cinn to the capacitors Cfp and Cfn, the output voltage is given by (Outp−Outn)=2×(Inp−Inn)+0.04×(VrefH−VrefL). That is, offset correction in an amount twice as large as that in the holding state in FIG. 7A is possible.

(Example of Holding with Correction of Third Offset Amount)

FIG. 7C is a circuit diagram showing the connection state of the sample and hold circuit 201 upon holding with correction of a third offset amount. Even in this case, the sampling state is the same as in FIG. 6A. The connection states of the capacitors C2 and C5 are different from those in the holding state without offset correction shown in FIG. 6B. Upon sampling, the capacitor C2 is connected to the reference voltage VrefH, and the capacitor C5 is connected to the reference voltage VrefL. Upon holding, a switch SW10 short-circuits the capacitors C2 and C5 to set them at an equipotential. Charges accumulated in the capacitors C2 and C5 then move to the capacitors Cfp and Cfn, and affect the output voltage. Since C2:Cfp=C5:Cfn=3:50, the amount is given by 0.06×(VrefH−VrefL). This is the offset correction amount. As a result, considering charge movement from the capacitors Cinp and Cinn to the capacitors Cfp and Cfn, the output voltage is given by (Outp−Outn)=2×(Inp−Inn)+0.06×(VrefH−VrefL). That is, offset correction in an amount three times as large as that in the holding state in FIG. 7A is possible.

Effect of Second Embodiment

As described above, the offset correction amount can be controlled using ternary weighted capacitors. In the second embodiment, ternary weighting is implemented using a method of short-circuiting the differential positive- and negative-side offset correction capacitors. Generally, the differential analog-to-digital conversion circuit 202 requires two kinds of reference voltages, that is, lower and higher reference voltages. However, sharing VrefL and VrefH as these reference voltages obviates the necessity of preparing a new reference voltage, and enables to further reduce the circuit scale.

Note that in the second embodiment, the capacitor C1 is connected to the reference voltage VrefH while the capacitor C4 is connected to the reference voltage VrefL upon sampling, and the capacitors C1 and C4 are short-circuited upon holding, thereby implementing offset correction of 0.02×(VrefH−VrefL). However, another connection method can also implement offset correction in the same amount. For example, even when the circuit operates so as to short-circuit the capacitors C1 and C4 upon sampling, and connect the capacitor C1 to the reference voltage VrefL and the capacitor C4 to the reference voltage VrefH upon holding, offset correction of 0.02×(VrefH−VrefL) can be implemented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-279813, filed Dec. 9, 2009, which is hereby incorporated by reference herein in its entirety.

What is claimed is:

1. A switched-capacitor input circuit which samples and holds an analog input signal, comprising:
   a differential amplifier;
   a first capacitor, one terminal of the first capacitor being connected to an inverting input terminal of the differential amplifier;
   a second capacitor, one terminal of the second capacitor being connected to a non-inverting input terminal of the differential amplifier;
   a first switch configured to connect the other terminal of the first capacitor to one of a first reference voltage and a second reference voltage, which is selected in accordance with a first control signal;
   a second switch configured to connect the other terminal of the second capacitor to one of the first reference voltage and the second reference voltage, which is selected in accordance with a second control signal; and
   a third switch configured to connect the other terminal of the first capacitor to the other terminal of the second capacitor, which is controlled in accordance with a third control signal.

2. The circuit according to claim 1, further comprising:
a plurality of third capacitors, one terminal of each of the plurality of third capacitors being connected to the inverting input terminal of the differential amplifier;
a plurality of fourth switches each configured to connect the other terminal of corresponding one of the plurality of third capacitors to one of the first reference voltage and the second reference voltage, which is selected in accordance with a fourth control signal;
a plurality of fourth capacitors, one terminal of each of the plurality of fourth capacitors being connected to the non-inverting input terminal of the differential amplifier; and
a plurality of fifth switches each configured to connect the other terminal of corresponding one of the plurality of fourth capacitors to one of the first reference voltage and the second reference voltage, which is selected in accordance with a fifth control signal.

3. The circuit according to claim 1, further comprising:
a third capacitor, one terminal of the third capacitor being connected to the inverting input terminal of the differential amplifier;
a fourth switch configured to connect the other terminal of the third capacitor to one of the first reference voltage and the second reference voltage, which is selected in accordance with a fourth control signal;
a fourth capacitor, one terminal of the fourth capacitor being connected to the inverting input terminal of the differential amplifier, a capacitance ratio of the first capacitor, the third capacitor and the fourth capacitor being 1:1:2;
a fifth switch configured to connect the other terminal of the fourth capacitor to one of the first reference voltage and the second reference voltage, which is selected in accordance with a fifth control signal;
a fifth capacitor, one terminal of the fifth capacitor being connected to the non-inverting input terminal of the differential amplifier;
a sixth switch configured to connect the other terminal of the fifth capacitor to one of the first reference voltage and the second reference voltage, which is selected in accordance with a sixth control signal;
a sixth capacitor, one terminal of the sixth capacitor being connected to the non-inverting input terminal of the differential amplifier, a capacitance ratio of the second capacitor, the fifth capacitor and the sixth capacitor being 1:1:2; and
a seventh switch configured to connect the other terminal of the sixth capacitor to one of the first reference voltage and the second reference voltage, which is selected in accordance with a seventh control signal.

4. The circuit according to claim 1, further comprising:
a third capacitor, one terminal of the third capacitor being connected to the inverting input terminal of the differential amplifier;
a fourth switch configured to connect the other terminal of the third capacitor to one of the first reference voltage and the second reference voltage, which is selected in accordance with a fourth control signal;
a fourth capacitor, one terminal of the fourth capacitor being connected to the inverting input terminal of the differential amplifier, a capacitance ratio of the first capacitor, the third capacitor and the fourth capacitor being 1:3:9;
a fifth switch configured to connect the other terminal of the fourth capacitor to one of the first reference voltage and the second reference voltage, which is selected in accordance with a fifth control signal;
a fifth capacitor, one terminal of the fifth capacitor being connected to the non-inverting input terminal of the differential amplifier;
a sixth switch configured to connect the other terminal of the fifth capacitor to one of the first reference voltage and the second reference voltage, which is selected in accordance with a sixth control signal;
a sixth capacitor, one terminal of the sixth capacitor being connected to the non-inverting input terminal of the differential amplifier, a capacitance ratio of the second capacitor, the fifth capacitor and the sixth capacitor being 1:3:9; and
a seventh switch configured to connect the other terminal of the sixth capacitor to one of the first reference voltage and the second reference voltage, which is selected in accordance with a seventh control signal.

5. The circuit according to claim 1, wherein the differential amplifier is a fully-differential amplifier.

6. The circuit according to claim 5, further comprising:
a first input capacitor connected to the inverting input terminal of the differential amplifier;
a second input capacitor connected to the non-inverting input terminal of the differential amplifier;
a first feedback capacitor connected between the inverting input terminal of the differential amplifier and a first output terminal of the differential amplifier; and
a second feedback capacitor connected between the non-inverting input terminal of the differential amplifier and a second output terminal of the differential amplifier.

7. The circuit according to claim 1, wherein a voltage applied to the other terminal of the first capacitor upon holding is different from a voltage applied to the other terminal of the first capacitor upon sampling, and a voltage applied to the other terminal of the second capacitor upon holding is different from a voltage applied to the other terminal of the second capacitor upon sampling.

* * * * *